United States Patent [19]

Latz et al.

[11] Patent Number: 5,043,716
[45] Date of Patent: Aug. 27, 1991

[54] ELECTRONIC DISPLAY WITH LENS MATRIX

[75] Inventors: William J. Latz, New Berlin; Thomas J. Mandler, Grafton, both of Wis.; Jason C. S. Lai, Taipei, Taiwan

[73] Assignee: Adaptive Micro Systems, Inc., Milwaukee, Wis.

[21] Appl. No.: 219,022

[22] Filed: Jul. 14, 1988

[51] Int. Cl.[5] .............................................. G09G 3/32
[52] U.S. Cl. ............................. 340/782; 340/815.31; 313/500; 313/512; 40/452; 40/547
[58] Field of Search ................... 340/762, 782, 815.03; 313/500, 512, 499, 498, 510; 40/547, 452, 550, 546; 362/32, 800

[56] References Cited

U.S. PATENT DOCUMENTS

| 4,254,453 | 3/1981 | Mouyard et al. | 340/762 |
| 4,306,716 | 12/1981 | James et al. | 340/762 |
| 4,603,496 | 8/1986 | Latz et al. | 313/500 |
| 4,754,202 | 6/1988 | Havel | 340/782 |
| 4,774,434 | 9/1988 | Bennion | 340/815.03 |
| 4,804,890 | 2/1989 | Havel | 340/782 |

*Primary Examiner*—Jeffrey A. Brier
*Attorney, Agent, or Firm*—Quarles & Brady

[57] ABSTRACT

An electronic display includes a matrix of LEDs mounted to a circuit board and selectively operated to produce a message or image. A reflector matrix mounts to the circuit board and provides light pipes which extend forward from each LED to direct its light and provide protection. Potting compound is disposed in each light pipe and extends beyond the reflector matrix to provide a convex lens. In one embodiment the potting compound extends into a convex lens cover.

12 Claims, 3 Drawing Sheets

ELECTRONIC DISPLAY WITH LENS MATRIX

BACKGROUND OF THE INVENTION

The field of the invention is electronic displays, and particularly, displays which employ a matrix of illuminating devices that are individually operated to produce illuminated alpha-numeric characters and graphic symbols.

Electronic displays which employ a matrix of illuminating devices are well-known in the art. Such displays may include a plurality of light emitting diodes (LEDs) which are mounted on a printed circuit board in an array. By selectively energizing the LEDs with electronic circuitry also on the circuit board, a variety of illuminated characters and symbols can be produced. To reduce cost and improve appearance, it is also common to attach the LED chips, or dies, directly to the printed circuit board and provide a shaped reflector over the LED dies. To protect the LED dies, the reflector is either covered with a transparent sheet material, or a transparent potting compound is poured over the dies. In either case, the front surface of these prior display arrays is flat.

While electronic displays of this type are quite satisfactory for many applications, their use in retail stores has been limited. In such an environment the ambient light is very intense and the light emitted by electronic displays is not sufficient to be clearly seen or to draw attention to itself.

One electronic display which obviates some of the problems of the prior art devices is disclosed in U.S. Pat. No. 4,603,496 which is commonly assigned. However, this particular display has a particular configuration for a lens matrix which can cause problems with light refractions and reducing the amount of displayed light.

SUMMARY OF THE INVENTION

The present invention relates to an electronic display which includes, in one embodiment, a printed circuit board having a plurality of light emitting devices mounted to its front surface and arranged in a pattern.

A reflector matrix is disposed over the front surface of the printed circuit board and has a plurality of openings formed therethrough which are aligned with the light emitting devices in the pattern. These provide a light pipe which extends forward from each light emitting device and directs light produced by the electronic illuminating devices away from the circuit board. A lens cover is disposed over the front surface of the reflector matrix and has a plurality of lenses which are aligned with the light pipes in the pattern to provide a convex lens portion over the forward end of each light pipe. A potting compound is disposed in each light pipe with the potting compound filling each light pipe and extending beyond the reflector matrix to fill the convex lens portion of the lens cover and redirect light emanating from the light pipes.

In another embodiment, a lens material is disposed over the front surface of the reflector matrix, and is composed of a potting compound disposed in each light pipe, the potting compound filling each light pipe and extending beyond the reflector matrix to provide a convex lens portion extending from the reflector matrix.

A general object of the invention is to provide an electronic display which provides greater illumination. Nearly all of the light produced by the electronic illuminating device is directed through its associated light pipe and out through the convex lens portion. Very little light is reflected back at the boundaries of the elements in the light path.

Another object of the invention is to provide an improved electronic display which is easy and economical to manufacture. The potting compound provides a major portion of the lens and serves to improve the transmission of light through each light pipe as well as to redirect light therefrom.

The foregoing and other objects and advantages of the invention will appear from the following description. In the description, reference is made to the accompanying drawings which form a part hereof, and in which there is shown by way of illustration preferred embodiments of the invention. Such embodiments do not necessarily represent the full scope of the invention, however, and reference is made therefore to the claims herein for interpreting the scope of the invention.

DESCRIPTION OF THE PREFERRED EMBODIMENTS

Figure 1:
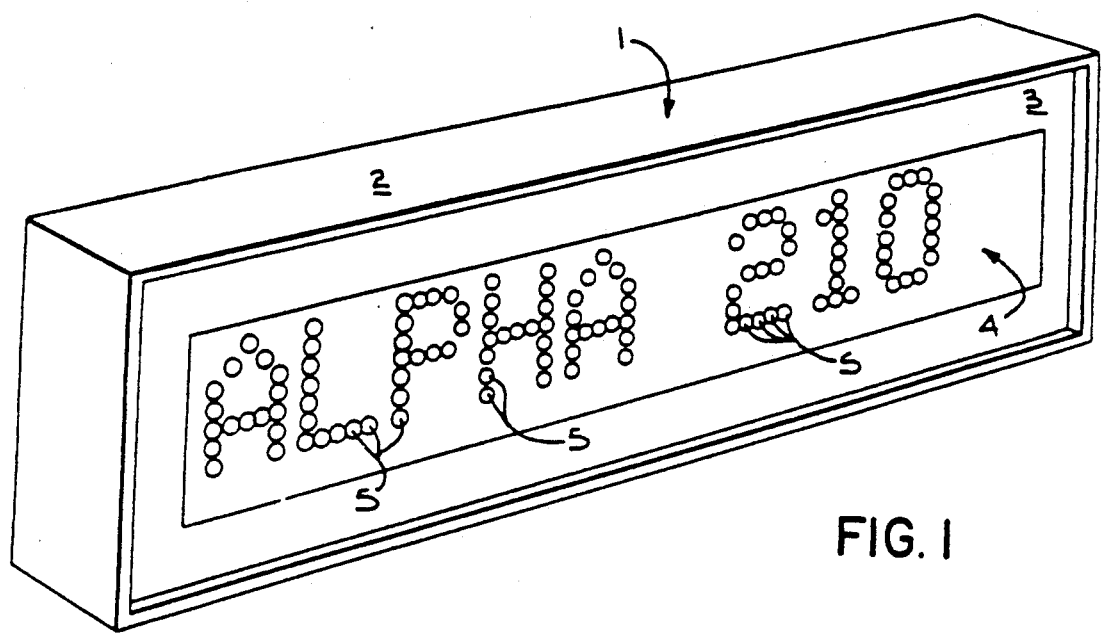
FIG. 1 is a perspective view of an electronic display which employs the present invention.

Referring particularly to FIG. 1, an electronic display 1 is housed in an enclosure 2 having a rectangular opening in its front wall 3 through which a display matrix 4 is directed. As will be described in more detail below, the display matrix 4 includes a plurality of illuminating devices 5 which are arranged side-by-side in columns and rows. An electronic circuit (not shown in the drawings) is mounted within the enclosure 2, and it is programmed to separately operate each illuminating device 5 such that a message or image is collectively produced in the rectangular opening.

The preferred illuminating device 5 for this application is a light emitting diode (LED). A LED may be driven directly by TTL logic circuitry making it a relatively inexpensive device to operate, and It does not contain a filament making it a relatively reliable device. However, LEDs produce a limited amount of light, and when the electronic display 1 is employed in locations where the ambient light level is high, this light must be efficiently delivered to the viewer if the message or image is to be clearly seen.

Figure 2:
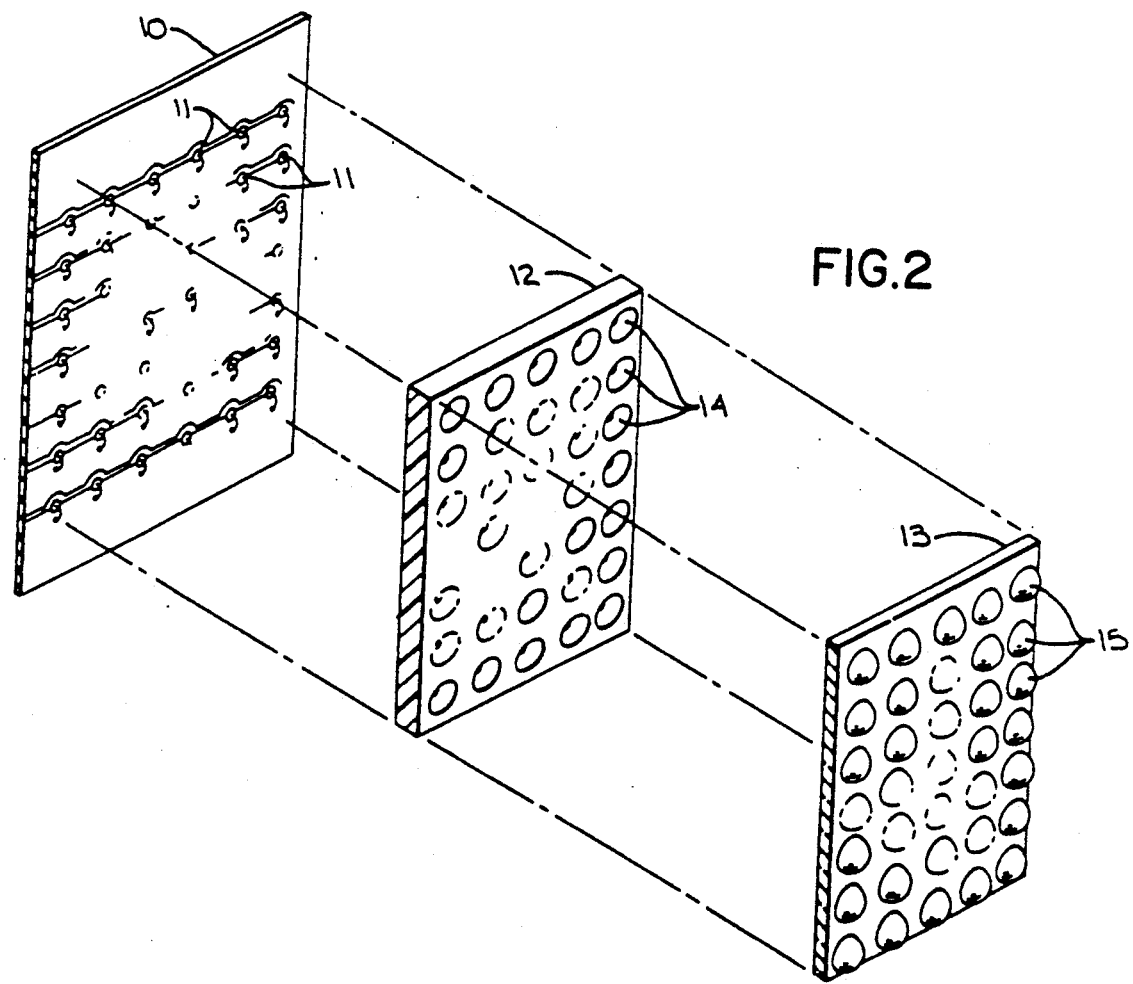
FIG. 2 is an exploded partial perspective view of a display matrix which forms part of the electronic display of FIG. 1.
Figure 3:
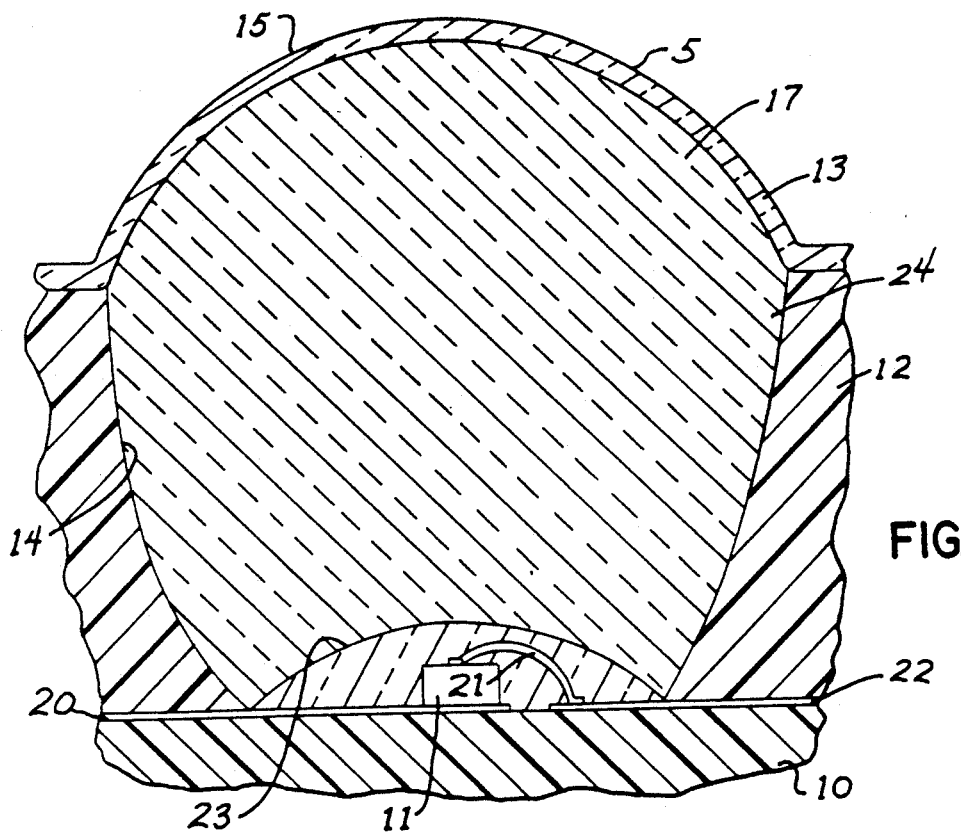
FIG. 3 is a view in cross section taken through one of the illuminating devices in the display matrix of FIG. 2.

Referring particularly to FIGS. 2 and 3, the display matrix of the present invention is a low cost, durable and efficient means for electronically displaying a message or image. It includes four basic elements: a printed circuit board 10 which supports a matrix of LED dies 11; a reflector matrix 12; potting compound 24; and a lens matrix 13. The LED dies 11 are arranged in rows and columns on the printed circuit board 10, and the reflector matrix 12 is placed over the LED dies 11 and bonded to the printed circuit board 10. Contoured openings extend through the reflector matrix 12 and are aligned with the matrix of LED dies 11 to form light pipes 14. The reflector matrix 12 is molded from a white ABS polymer material and each light pipe 14 forms a polished reflector which directs the light produced by its associated LED die 11 out to a viewer. The lens matrix 13 is molded from a clear acrylic polymer material and it includes separate convex lens elements 15 which are aligned with the matrix of light pipes 14. The lens matrix 13 is bonded to the front of the reflector matrix 12 It has a convex lens portion with a concave back portion which forms the potting compound 24 into a convex lens portion 17 over each light pipe 14 when the potting compound is filled into the concave back portion.

The resulting structure is shown in detail in FIG. 3. The LED die 11 is attached to a gold plated conductive pad 20 on the front surface of the printed circuit board 10 with a silver epoxy. After curing the silver epoxy a bond wire 21 is ultrasonically bonded to the LED die 11 at one end and bonded to a second conductive pad 22 at the other end. The LED die 11 is then coated with a layer 23 of a urethane polymer such as "Hysol PC-18," which protects the LED die 11 and bond wire 21 during the remaining manufacturing process.

One method for producing the illuminating device 5 of FIG. 3 is shown in FIGS. 4–7 where similar components are indicated with the same numbers except followed with an "A".

Figure 5:
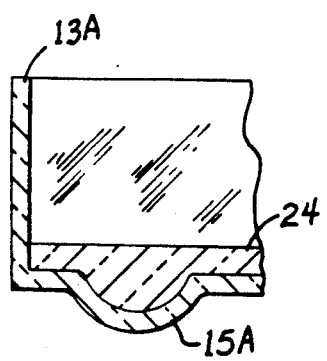
FIGS. 5-7 are partial views in vertical section illustrating a preferred method for manufacturing the embodiment of FIG. 4.
Figure 6:
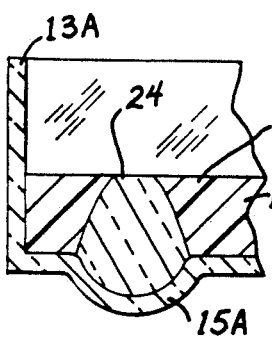
Figure 7:
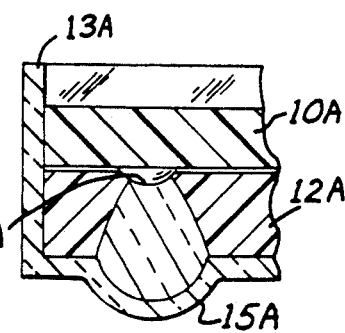

The lens matrix 13A is filled with potting compound 24 to a level indicated in FIG. 5. The reflector matrix 12A is then placed in the lens matrix 13A with the grooves 35 aligned with the locating ribs 36 and the light pipe cavities 14 are filled with the potting compound 24 as shown in FIG. 6 Epoxy, such as "Hysol OS 4201" and containing a small amount of diffusant material such as "Hysol AC 7088 Resin" in a silicon base, is preferred. It is degassed to prevent the formation of air bubbles in the light pipe cavities 14A. The circuit board 10A is then placed over the reflector matrix 12A with the locator openings 33 aligned with the pins 32 and the grooves 34 aligned with the ribs 36. Additional potting compound can be added so as to fill the remaining capacity of the lens matrix 13A as viewed in FIG. 7.

Figure 8:
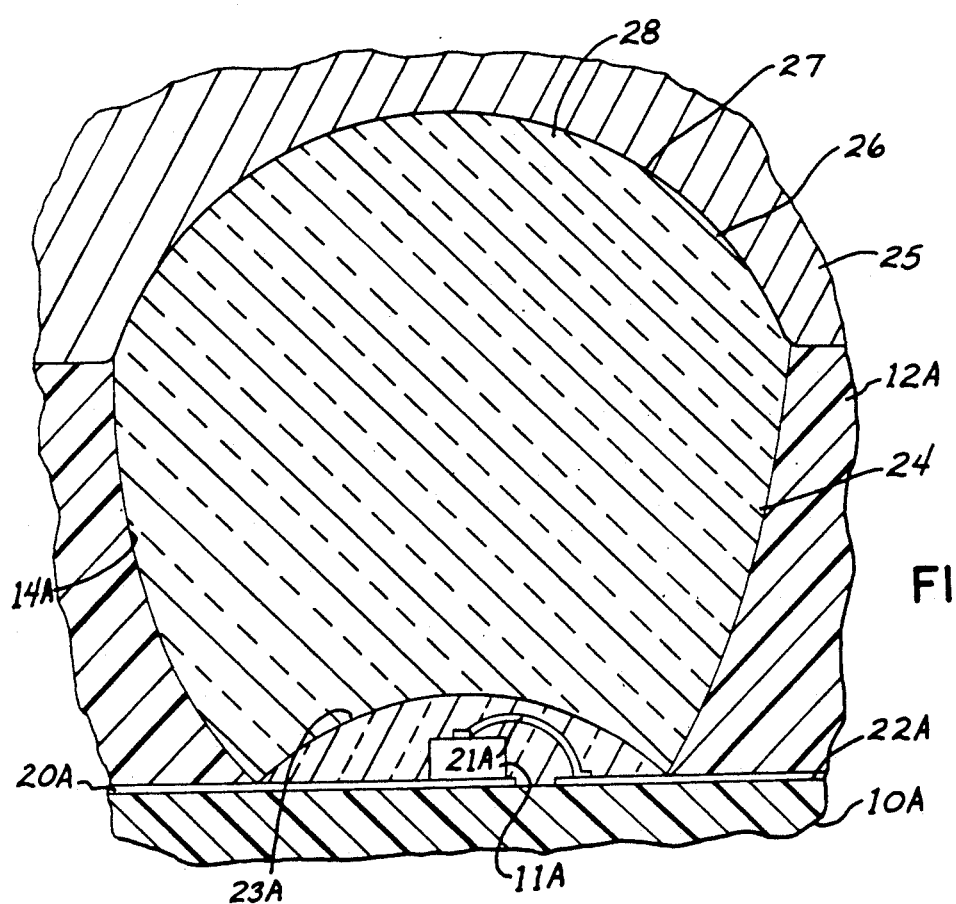
FIG. 8 is a view similar to FIG. 3 showing another preferred embodiment.
Figure 4:
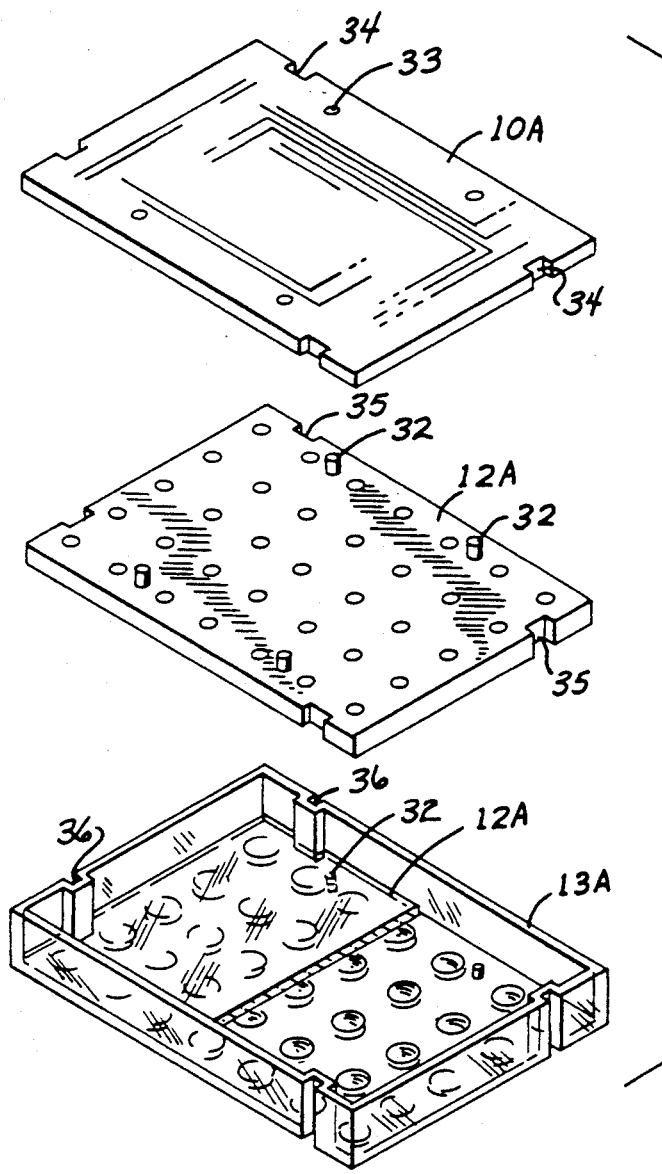
FIG. 4 is a view similar to FIG. 2 showing one of the preferred embodiments.

FIG. 8 illustrates an embodiment wherein the lens matrixes are eliminated. In this embodiment, the potting compound is formed in a manner to provide a convex lens portion 28. This is effected by use of die a 25 having a concave surface 26 to provide a convex lens surface 27. The assembly of this embodiment will be the same as previously described in FIGS. 4–7 except the die 25 is substituted for the lens matrix. The initial orientation of the die 25, the reflector matrix 12A and the circuit board 10A will be opposite that shown in FIG. 8 for purposes of filling with the potting compound 24. FIG. 8 shows the embodiment in the final cured state.

Referring to FIGS. 3 and 8, the resulting structure insures that light which is produced by the LED dies 11 and 11A when electrical power is applied to the conductive pads 20, 20A, 22 and 22A is efficiently delivered to an observer. The urethane layer 23 and 23A, potting compound 24 and lens 15 all have an index of refraction which is substantially greater than that of air. Indeed, the indexes of refraction of these materials and the material through which light passes from the LED die 11 are substantially the same. As a result, the critical angles at which light is totally reflected at the boundaries of these materials is large and very little light is reflected back and lost to the viewer. While the critical angle at the boundary between the front surface of the lens 15 and air is small, its convex shape and distance from the LED die 11 insures that most of the incident light is received at a small incident angle and is passed through to the viewer. In those instances in the prior art where the potting compound also composes the lens, it is depicted with a flat surface and illustrates a structure which is not feasible to manufacture.

It should be apparent to those skilled in the art that a number of variations may be made from the preferred embodiment without departing from the spirit of the invention. For example, the arrangement and shape of the light pipes 14 and the matching lens matrix 13 or lens surface 27 may be changed to produce other visual effects. The light pipes may be rectangular and the resulting image may be a familiar seven-segment display rather than the dot matrix display described herein. In such case, each lens 15 or lens surface 27 has a cylindrical shape over its lengthwise dimension rather than the domed, spherical shape of the preferred embodiment. Also, the convex lens elements 15 in the preferred embodiment have a concave back surface. The back surface of the lens element 15 can have other shapes without unduly reducing the amount of light.

We claim:

1. An electronic display which comprises:
   a printed circuit board having a plurality of light emitting devices mounted to its front surface and arranged in a pattern;
   a reflector matrix disposed over the front surface of the printed circuit board and having a plurality of openings formed therethrough which are aligned with the light emitting devices in said pattern to provide a light pipe which extends forward from each light emitting device;
   a lens cover disposed over the front surface of the reflector matrix and having a plurality of lenses which are aligned with the light pipes in said pattern to provide a convex lens portion over the forward end of each light pipe, said convex lens portion having a concave back portion; and
   a petting compound disposed in each light pipe, the potting compound filling each light pipe and extending beyond the reflector matrix to fill the concave back portion of the lens cover, the potting compound being the sole material occupying the light pipe except for any material covering said light emitting devices.

2. The electronic display as recited in claim 1 in which the light emitting devices are light emitting diodes.

3. The electronic display as recited in claim 1 in which the potting compound is an epoxy compound.

4. The electronic display as recited in claim 3 in which the potting compound contains a light diffusing material.

5. The electronic display as recited in claim 2 in which a transparent protective material is disposed dover each light emitting diode.

6. The electronic display as received in claim 5 in which the protective material is a urethane.

7. The electronic display as recited in claim 1 in which the potting compound and the lens cover have substantially the same index of refraction.

8. The electronic display as recited in claim 5 wherein said light emitting diode is covered with a solidified material having a convex configuration and having substantially the same index of refraction as said potting compound and said lens cover.

9. An electronic display which comprises:
- a printed circuit board having a plurality of light emitting devices mounted to its front surface and arranged in a pattern;
- a reflector matrix disposed over the front surface of the printed circuit board and having a plurality of openings formed therethrough which are aligned with the light emitting devices in said pattern to provide a light pipe which extends forward from each light emitting device; and
- a lens material disposed over the front surface of the reflector matrix, said lens material composed of a potting compound disposed in each light pipe, the potting compound filling each light pipe and extending beyond the reflector matrix to provide a convex lens portion extending from said reflector matrix, the potting compound being the sole material occupying the light pipe except for any material covering said light emitting devices.

10. The electronic display as recited in claim 9 wherein aid potting compound is an epoxy compound.

11. The electronic display as recited in claim 9 wherein said light emitting devices are covered with a solidified lateral having a convex configuration.

12. The electronic display as recited in claim 10 wherein said epoxy compound contains a diffusant material.

* * * * *

UNITED STATES PATENT AND TRADEMARK OFFICE
CERTIFICATE OF CORRECTION

PATENT NO. : 5,043,716

DATED : August 27, 1991

INVENTOR(S) : Latz et al.

It is certified that error appears in the above-identified patent and that said Letters Patent is hereby corrected as shown below:

| | |
|---|---|
| Column 1, line 52 | "mat ix" should read --matrix-- |
| Column 3, line 38 | Insert a period after "Fig. 6" |
| Column 4, line 46 (Claim 1) | "petting" should read --potting-- |
| Column 4, line 63 (Claim 5) | "dover" should read --over-- |
| Column 4, line 64 (Claim 6) | "received" should read --recited-- |
| Column 6, line 9 (Claim 10) | "aid" should read --said-- |
| Column 6, line 12 (Claim 11) | "lateral" should read --material-- |

Signed and Sealed this

Twelfth Day of January, 1993

Attest:

DOUGLAS B. COMER

Attesting Officer   Acting Commissioner of Patents and Trademarks